United States Patent [19]

Wei et al.

[11] Patent Number: 5,041,802

[45] Date of Patent: Aug. 20, 1991

[54] LOW POWER OSCILLATOR WITH HIGH START-UP ABILITY

[75] Inventors: Tom S. Wei, San Jose; Andre Walker, Campbell; Elisabeth Ekman, San Jose, all of Calif.

[73] Assignee: Zilog, Inc., Campbell, Calif.

[21] Appl. No.: 419,765

[22] Filed: Oct. 11, 1989

[51] Int. Cl.$^5$ .............................................. H03B 5/36
[52] U.S. Cl. ............................... 331/116 FE; 331/158
[58] Field of Search ........ 331/116 R, 116 FE, 117 R, 331/117 FE, 158; 1/167

[56] References Cited

U.S. PATENT DOCUMENTS

| | | | |
|---|---|---|---|
| 4,218,661 | 8/1980 | Imamura | 331/116 FE |
| 4,307,354 | 12/1981 | Miyagawa et al. | 331/116 FE |
| 4,651,113 | 3/1987 | Fujita | 331/116 FE X |

FOREIGN PATENT DOCUMENTS

| | | | |
|---|---|---|---|
| 0021754 | 2/1977 | Japan | 331/116 FE |
| 0214305 | 12/1984 | Japan | 331/116 FE |
| 7604179 | 10/1976 | Netherlands | 331/116 FE |

Primary Examiner—David Mis
Attorney, Agent, or Firm—Majestic, Parsons, Siebert & Hsue

[57] ABSTRACT

In an oscillator circuit, a high gain, high power driver is placed in parallel with a standard low gain, low power driver for driving the oscillator output. A control signal is derived from the output of the oscillator circuit and fed back to control the high gain driver. After the circuit output has achieved stable oscillations for a predetermined time period, the high gain driver is turned off. Employment of the high gain driver ensures high start-up ability. The overall power consumption remains low since the high gain driver is turned off after stable oscillations have been achieved.

9 Claims, 5 Drawing Sheets

LOW POWER OSCILLATOR WITH HIGH START-UP ABILITY

BACKGROUND OF THE INVENTION

This invention relates in general to oscillator circuits and in particular to a low power oscillator which combines high start-up ability with low power consumption.

The output of an oscillator circuit is used to drive any of a variety of devices. For this purpose, it is desirable for the oscillator output to provide stable signals of sufficient amplitude and for the oscillator output to reach such state as soon as possible to minimize the time one must wait before the oscillator output can be used to drive different devices. Hence it is in general desirable for oscillator circuits to have high start-up ability.

One way to achieve good start-up ability is to employ a high gain, high power driver for driving the oscillator output, where the driver usually entails larger device geometries. While the high gain, high power driver ensures good start-up ability even with higher resistance crystals or resonators, such drivers will also cause a larger current in the circuit and consumes more power. Furthermore, even after the oscillator has completed its start-up cycle to achieve a stable output, the high gain, high power driver tends to distort the output waveform. The distorted output waveform creates harmonics in the signal and can cause electromagnetic interference with other electronics components. In order to avoid the undesirable effects of using high gain, high power drivers, circuit designers may prefer lower gain, lower power drivers with poorer start-up ability. In other words, circuit designers are forced to compromise in choosing between characteristics of high gain, high power drivers with good start-up ability on the one hand and lower gain, lower power drivers with poor start-up ability. It is therefore desirable to provide oscillator circuits with both high start-up ability and low power consumption.

SUMMARY OF THE INVENTION

This invention is based on the observation that in addition to using only one low gain, low power driver for driving the oscillator output as in conventional designs, a second high gain, high power driver is placed in parallel to the standard low gain, low power driver, where both drivers are used to drive the oscillator output upon start-up. After stable oscillator output is achieved, the high gain, high power driver is turned off. A control signal is derived from the circuit output. The control signal is then applied to the high gain, high power driver to disable the driver a predetermined time after stable oscillator output is achieved. This invention is directed towards an oscillator circuit, which comprises an oscillator having an output, a first driver for driving the oscillator output and the second driver arranged in parallel to the first driver for driving the oscillator output. The circuit output is derived from the oscillator output. The circuit further comprises feedback control means for deriving a control signal from the circuit output. The control signal is applied to the second driver to disable the second driver a predetermined time after stable oscillator output is achieved.

DETAILED DESCRIPTION OF THE DRAWINGS

DETAILED DESCRIPTION OF THE INVENTION

Figure 1:
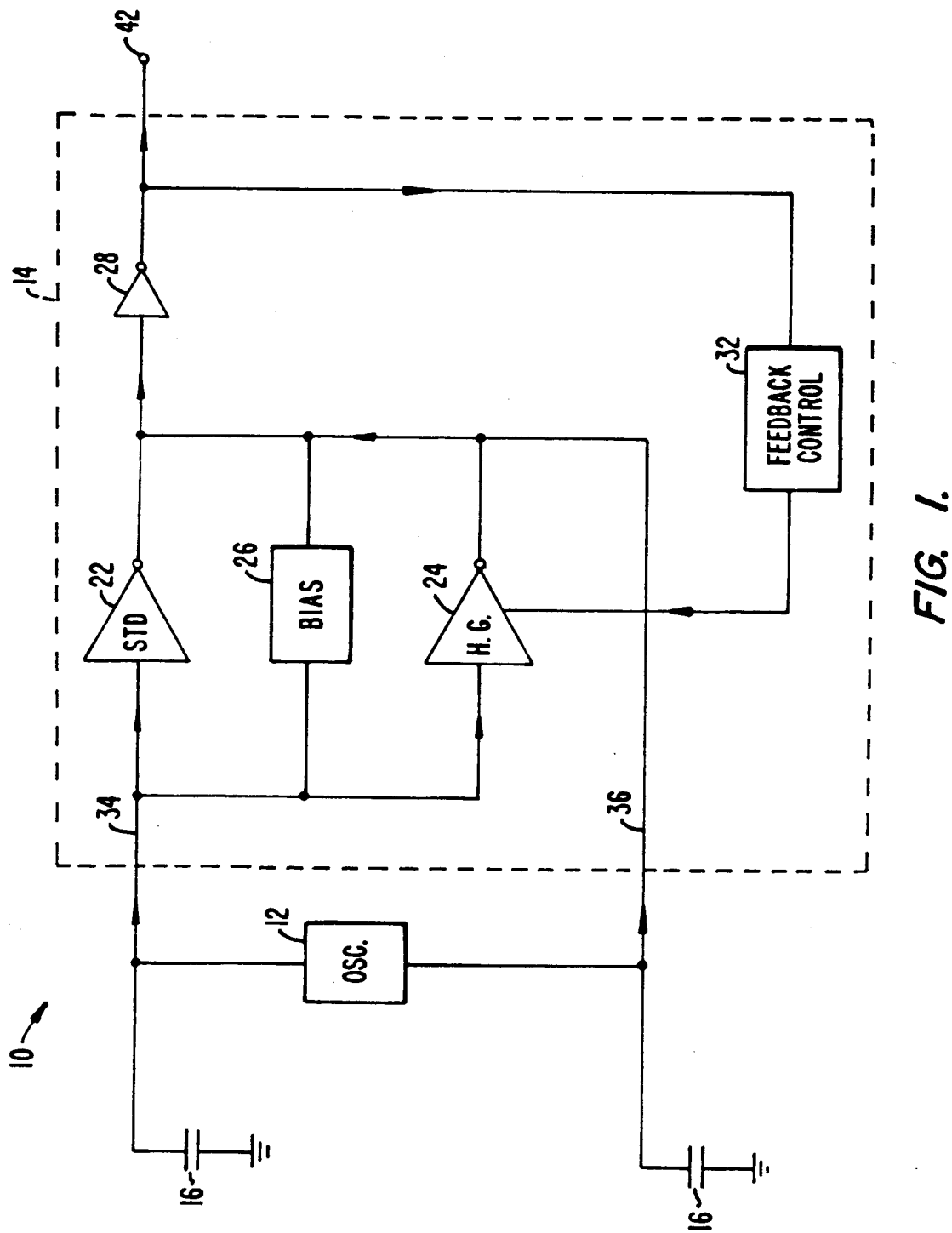
FIG. 1 is a block diagram of an oscillator with high start-up ability but low power consumption to illustrate the invention.

FIG. 1 is a block diagram of an oscillator circuit to illustrate the invention. The oscillator circuit 10 comprises an oscillator 12, a driver circuit 14 and capacitors 16 as shown in FIG. 1. Driver circuit 14 drives the output of oscillator 12. Oscillator 12 may be a crystal or inductive resonator. Driver circuit 14 includes a standard (STD) low gain, low power driver 22, a high gain driver 24 and bias circuit 26 where drivers 22 and 24 are placed in parallel for driving the oscillator output. Bias circuit 26 is used to enable the oscillator output to become stable quickly. Driver circuit 14 also includes an inverter 28 whose output changes state only when the magnitude of the signal at its input exceeds a certain threshold or trip point. Feedback control circuit 32 derives a control signal from the output of the driver circuit 14 for enabling or disabling the high gain driver 24. Thus in addition to the standard low gain, low power driver and bias circuit employed in conventional oscillator circuits, driver circuit 14 includes high gain driver 24 and feedback control 32.

Oscillator 12 provides oscillating output on lines 34, 36. The output of oscillator 12 is amplified by standard driver 22 and high gain driver 24, where the outputs of the two drivers are added and applied to inverter 28. When the combined output of drivers 22, 24 has a magnitude which exceeds the threshold or trip point of inverter 28, the output of the inverter changes state so that the output 42 of circuit 10 is caused to provide an oscillating square wave signal. This square wave signal is then used for driving other devices. Feedback control circuit 32 derives a control signal from the output 42 to turn off the high gain driver 24 a predetermined time after the output at 42 achieves a stable oscillating state.

Oscillator circuit 10 has high start-up ability since an additional high gain driver 24 is provided to amplify the output of oscillator 12 so that the magnitude of the combined outputs of drivers 22, 24 will quickly exceed the threshold of inverter 28 to provide a steady oscillating output at output 42. A predetermined time after the output 42 achieves a steady oscillating state, feedback control 32 causes the high gain, high power driver 24 to be turned off. Hence power consumption is high only during the start-up of circuit 10. After steady oscillating state is reached, power consumption is greatly reduced so that circuit 10 consumes no more power than a conventional low gain, low power oscillator circuit. Therefore, as compared to conventional high gain, high power oscillator circuits, oscillator circuit 10 has similar high start-up ability but it consumes much less power. As compared to conventional low gain, low power oscillator circuits, oscillator circuit 10 has much better start-up ability without significantly increasing the power consumption level.

Figure 2:
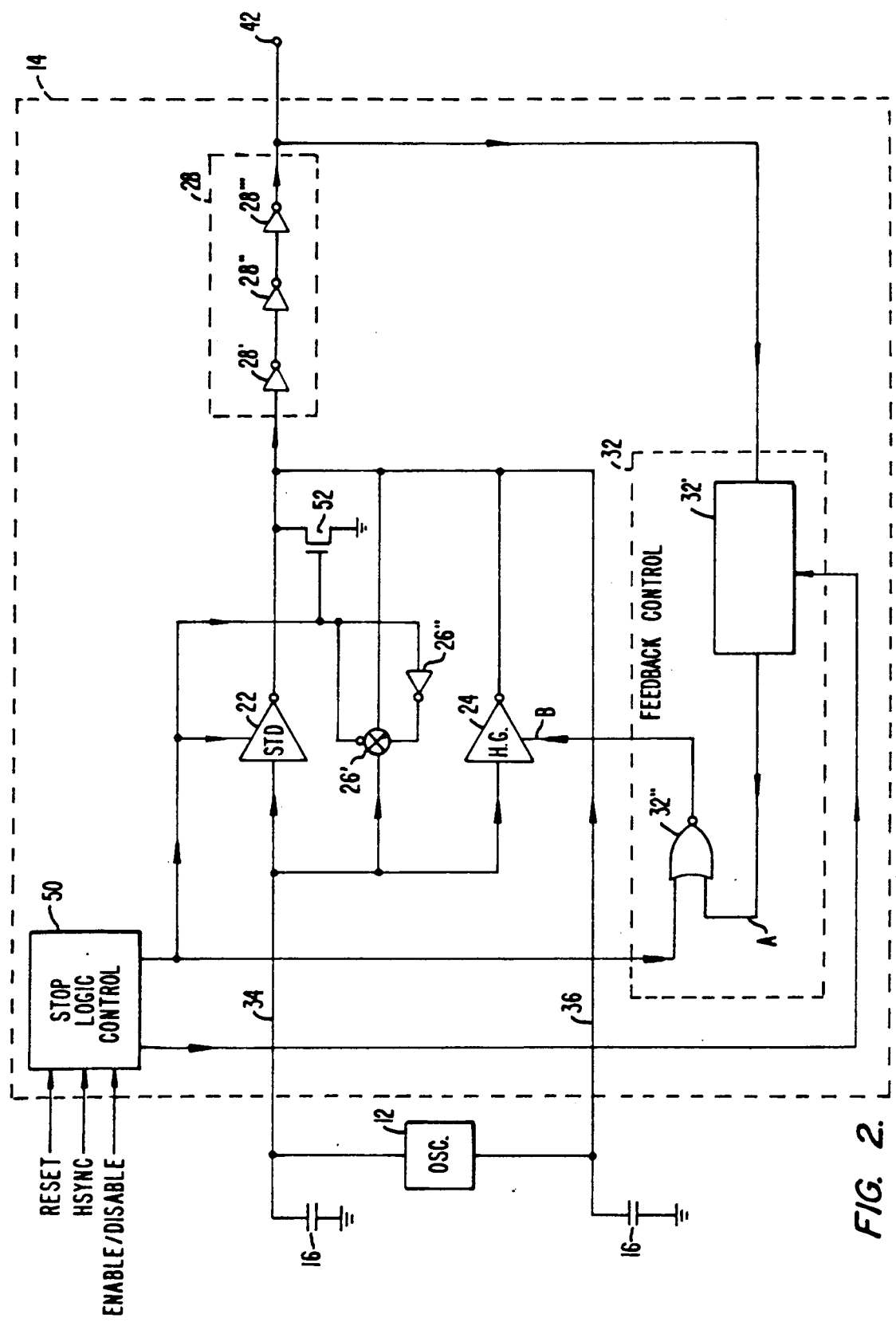
FIG. 2 is a block diagram of an oscillator showing in more detail the features of the oscillator circuit of FIG. 1 as well as additional control features to illustrate the preferred embodiment of the invention.
Figure 3:
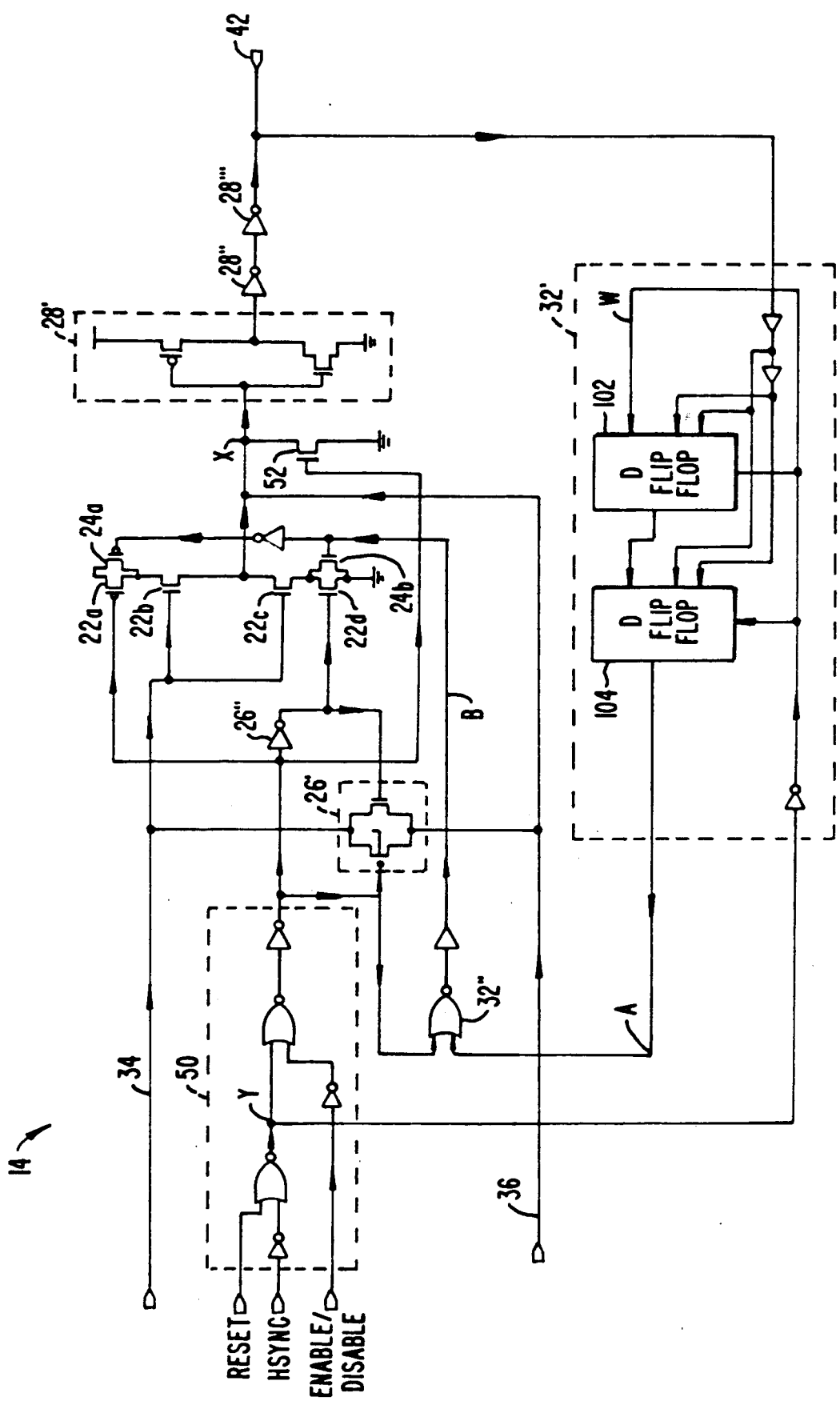
FIG. 3 is a schematic circuit diagram of an oscillator circuit illustrating in more detail the circuit of FIG. 2.

FIG. 2 is a block diagram illustrating in more detail the circuit of FIG. 1. For simplicity in understanding, identical components in the figures are identified by the same numerals. Comparing FIGS. 1 and 2, bias circuit includes transmission gate 26' and inverter 26''. Inverter 28 includes three inverters 28', 28'', 28''' placed in series. In FIG. 2, feedback control 32 of FIG. 1 includes a NOR gate 32'' shown separately from the remaining components 32' of the feedback control system 32 to more clearly illustrate the invention. A stop logic control circuit 50 is employed to provide better control of the oscillator circuit 14. A transistor 52 is also provided to provide better control. The operation of circuit 14 will now be described in detail in reference to FIGS. 2-5. To disable circuit 14, the enable/disable input to stop logic control 50 is at logic low. Irrespective of the status of RESET and horizontal synchronization (HSYNC) signals (such as those used in television), transistors 22a, 22d are turned off (see FIG. 3). The standard (STD) driver 22 comprises transistors 22a, 22b, 22c, 22d in reference to FIGS. 1-3. This means that the standard driver is turned off. The high gain driver 24 comprising transistors 24a, 24b is also turned off when the enable/disable line is low in reference to FIG. 3. Hence when enable/disable line is low, driver circuit 14 is turned off.

Figure 4:
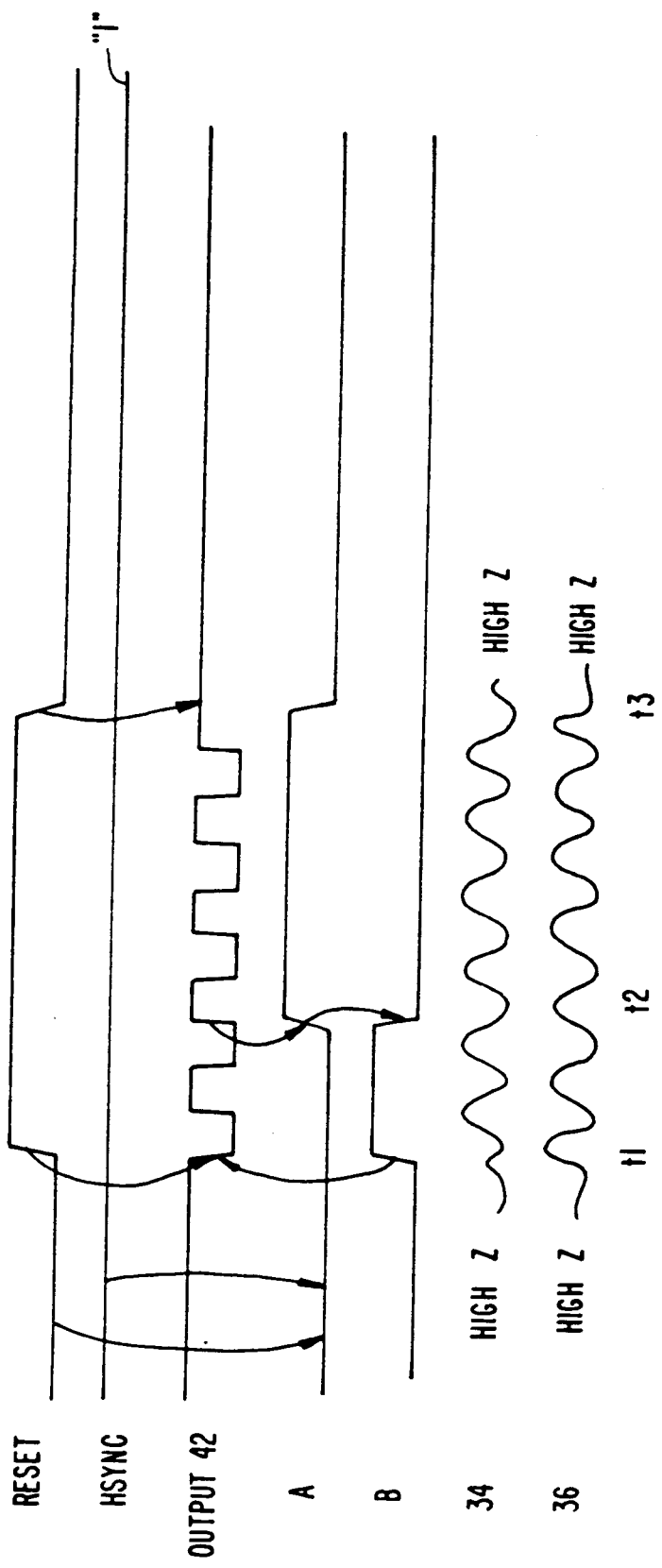
FIGS. 4 and 5 are timing diagrams for illustrating the operation of the circuit of FIG. 3.

Driver circuit 14 may be controlled by either the RESET or the HSYNC signal. The case where circuit 14 is controlled by the RESET signal is illustrated in FIG. 4. In such event, the HSYNC signal is always high (i.e. "1"). The status of circuit 14 before oscillations start will first be described. This occurs when signal RESET is low. Thus when the RESET signal is low, node Y and the output of stop logic control 50 are high and node B is low, thereby turning off transistors 22a, 22d, 24a, 24b so that driver circuit 14 is turned off. Since the output of circuit 50 is high, transistor 52 causes node X to be pulled to ground so that the output 42 is high as shown in FIG. 4. Node Y is also high so that the flip-flops 102, 104 are reset. Node A is therefore low as shown in FIG. 4. Since the output of stop logic control 50 is high, node B is also low. These are the signal conditions of circuit 14 in the standby mode when the signal RESET is used to control the circuit.

When it is desired to start up the oscillator, oscillator 12 provides oscillations to lines 34, 36 illustrated in FIG. 4. At about the same time, RESET line is set to high at time t1. Transistor 52 is turned off so that output 42 is thereby released and is controlled by the output of the two drivers 22, 24.

When RESET goes high, node Y goes low and so the output of circuit 50. This turns on does the output of circuit 50. This turns on transistors 22a, 22d, 24a, 24b to permit the two drivers to amplify the oscillations present on lines 34, 36. Transistors 24a, 24b have large width to length ratios with low impedance so that the magnitude of the signal at node X quickly exceeds the threshold or trip point of inverter 28', achieving quick start-up. The output 42 therefore quickly follows the oscillations on lines 34, 36 after time t1 as shown in FIG. 4. Driver circuit 14 therefore has high start-up ability. Two additional inverters 28'', 28''' are preferably provided to ensure a steady output level at 42 and to provide sufficient power to drive other devices from output 42. It will be understood that a different number of invertors may be employed; all such variations are within the scope of the invention.

At time t1, node A is low and so is the output of circuit 50. Therefore, node B is high, thereby turning on transistors 24a, 24b. Since node Y is low, node W is high after time t1. The output at 42 is fed back as clock signals to D flip-flops 102, 104 which respond to the rising edge of output 42. Since there are two flip-flops, at the second rising edge of output 42 at time t2, the high logic state of node W appears at the output of flip-flop 104, thereby causing node A to rise to the high logic state as shown at time t2 in FIG. 4. This forces the output of NOR gate 32'' low, thereby pulling node B to logic low at t2. This turns off the high gain driver 24 comprising transistors 24a, 24b approximately at time t2. In other words, the high gain driver is turned off after one and a half cycles of oscillations of output 42. Therefore, under steady state oscillation conditions, driver 24 is turned off and only driver 22 provides the low gain required to sustain the oscillations. Therefore, for only one and a half cycles is circuit 14 operating at high gain and high power. After the one and a half cycles, that is, on the second rising edge of output 42, circuit 14 functions at a low power, low gain state. Circuit 14 together with oscillator 12 therefore provide a low power oscillator circuit with high start-up ability.

The threshold or trip point of inverter 28' is selected so that its output changes state only after the magnitude of the signal at node X exceeds a certain level to ensure stable oscillations at output 42. Thus, until the magnitude of the signal at node X exceeds a certain predetermined level, output 42 will not change state to turn off the high gain driver.

Figure 5:
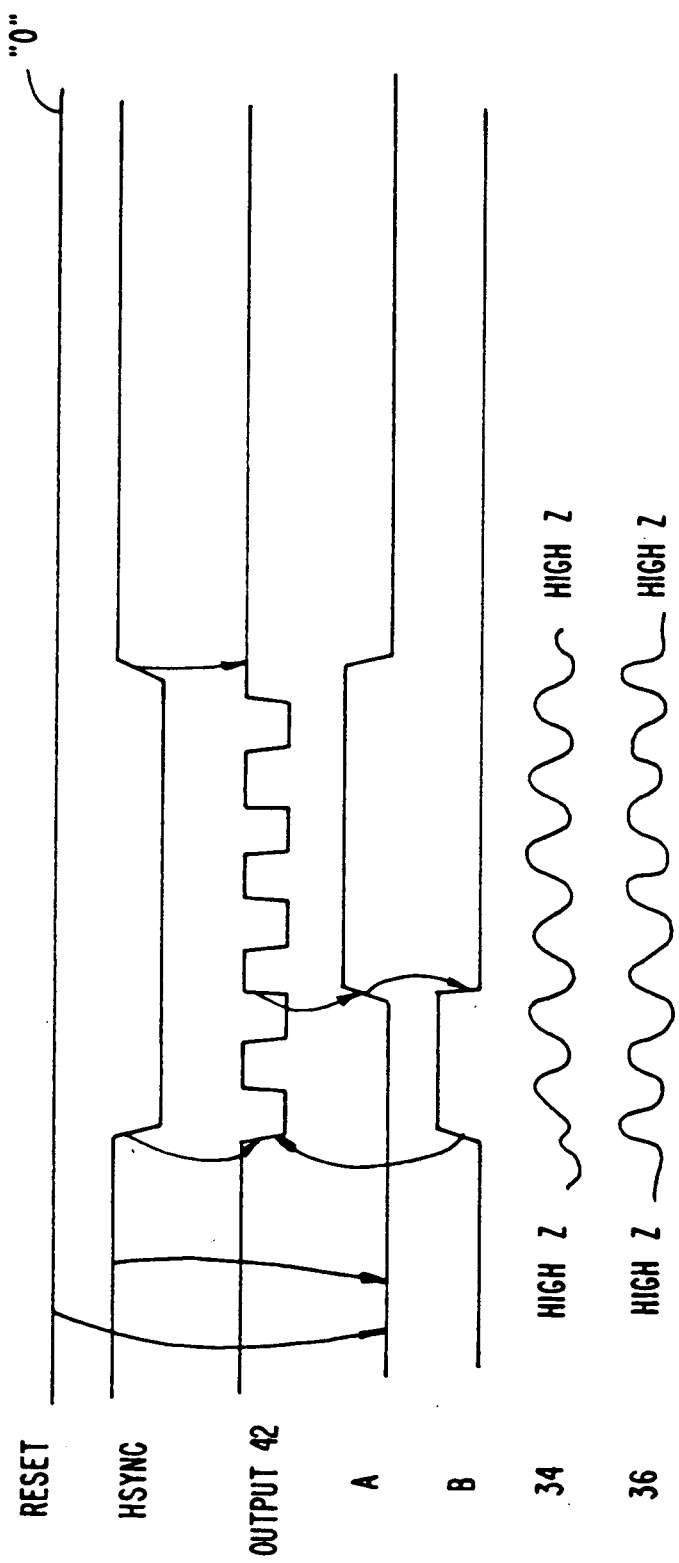

When it is desired to turn off the oscillator circuit, RESET signal is pulled low. This causes node Y and the output of circuit 50 to be pulled high. This turns on transistor 52 which causes node X to be pulled low and the output 42 to remain high. Node Y being high also causes flip-flops 102, 104 to be reset, pulling node A low. Circuit 14 therefore returns to the standby mode ready for another start-up operation. The above concludes the description of circuit 14 where the RESET signal controls the circuit.

Where circuit 14 is controlled by the signal HSYNC instead of RESET, the timing of the various signals is illustrated in FIG. 5. Except for polarity difference, the two signals RESET, HSYNC are entirely symmetrical so that the signal HSYNC controls the operation of circuit 14 in exactly the same manner as the signal RESET as described above. Where the signal HSYNC is used to control circuit 14, the signal RESET remains low.

From the above, it is evident that the objective of the invention has been achieved. Both the standard low gain and high gain drivers are turned on in starting up the oscillating circuit. The magnitude of oscillations is monitored. The high gain driver is turned off only after stable oscillations have been achieved at output 42 for a predetermined time period. This predetermined time period is set by selecting the number of flip-flops such as flip-flops 102, 104 in FIG. 3. Where two flip-flops are selected, the high gain driver is turned off after one and a half cycles of oscillations at output 42. The predetermined time period can be increased by increasing the number of flip-flops.

The invention has been described in reference to particular embodiments. It will be understood that various modifications may be made to the specific embodiments described without exceeding the scope of the invention which is to be limited only by the appended claims.

What is claimed is:

1. An oscillator circuit responsive to a recurring signal said circuit having an output, said circuit comprising:
   a resonator having an output;
   a driver having a plurality of primary active elements at least one of which is adapted to receive the resonator output, said driver providing an output in response to said resonator output;
   a plurality of secondary active elements, each of said secondary active elements being connected in parallel with a corresponding primary active element of said driver, said secondary elements operative to reduce the impedance of said corresponding primary elements, thereby, increasing the gain of said driver;
   feedback control means for deriving a control signal from the circuit output, said feedback control means adapted to derive said control signal a predetermined number of oscillation cycles after stable oscillation output is achieved, said control signal being applied to each of said secondary elements to disable said secondary elements to reduce power consumption; and
   stop logic control means responsive to the recurring signal for turning on and off the driver, turning on and off the secondary active elements, resetting circuit and resetting the feedback control means.

2. The circuit of claim 1, further comprising inverter means suitable for providing the output of the circuit in response to the driver output, said circuit output being caused to change state only when the driver output is stable.

3. The circuit of claim 2, wherein said inverter means has a threshold and causes the circuit output to change state only when the magnitude of the driver output exceeds the threshold of the inverter means.

4. The circuit of claim 3, wherein said control signal causes the secondary active elements to be disabled at a predetermined number of oscillator cycles after the magnitude of the driver output exceeds the threshold of the inverter means.

5. The circuit of claim 4, wherein said feedback control means comprises two or more D flip-flops arranged in series, said circuit output connected to the clock input of each flip-flop so that the predetermined number of oscillator cycles is determine by the number of flip-flops.

6. The circuit of claim 1, wherein said feedback control means comprises one or more flip-flops arranged in series.

7. The circuit of claim 6, wherein the circuit output is applied to the flip-flops as clock signals, and wherein the stop logic control means provides a signal to the flip-flops which is fed back to the secondary active elements after a predetermined number of circuit output cycles.

8. The oscillator circuit of claim 1 wherein the primary and secondary active elements are transistors.

9. The circuit of claim 8 wherein said transistors are CMOS transistors.

* * * * *